(12) United States Patent
Jeanne et al.

(10) Patent No.: US 8,470,190 B2
(45) Date of Patent: Jun. 25, 2013

(54) METHOD FOR PROCESSING PORTIONS OF WALLS OF AN OPENING FORMED IN A SILICON SUBSTRATE

(75) Inventors: Edgard Jeanne, Saint Cyr sur Loire (FR); Sylvain Nizou, Noizay (FR)

(73) Assignee: STMicroelectronics S.A., Montrouge (FR)

( * ) Notice: Subject to any disclaimer, the term of this patent is extended or adjusted under 35 U.S.C. 154(b) by 1313 days.

(21) Appl. No.: 12/173,925

(22) Filed: Jul. 16, 2008

(65) Prior Publication Data
US 2010/0003573 A1    Jan. 7, 2010

(30) Foreign Application Priority Data
Jul. 18, 2007 (FR) ...................... 07 56571

(51) Int. Cl.
*C03C 15/00* (2006.01)
(52) U.S. Cl.
USPC ................. 216/62; 216/66; 216/79; 438/705; 438/719; 438/753

(58) Field of Classification Search
USPC ................. 216/62, 66, 79; 438/705, 719, 753
See application file for complete search history.

(56) References Cited

U.S. PATENT DOCUMENTS

| | | | |
|---|---|---|---|
| 5,460,693 A | 10/1995 | Moslehi | |
| 6,362,040 B1 * | 3/2002 | Tews et al. | 438/246 |
| 6,717,200 B1 | 4/2004 | Schamberger et al. | |
| 6,846,744 B1 * | 1/2005 | Chen | 438/700 |
| 2004/0248364 A1 * | 12/2004 | Hsiao et al. | 438/243 |
| 2004/0250392 A1 * | 12/2004 | Chou et al. | 29/25.01 |

OTHER PUBLICATIONS

French Search Report dated Mar. 5, 2008 from French Patent Application 07/5657.

* cited by examiner

*Primary Examiner* — Binh X Tran
(74) *Attorney, Agent, or Firm* — Wolf, Greenfield & Sacks, P.C.

(57) ABSTRACT

A method for processing at least one wall of an opening formed in a silicon substrate, successively including the steps of implanting fluorine atoms into an upper portion of the wall of the opening, performing an oxidization step, and applying a specific processing to at least a portion of the non-implanted portion of the opening.

18 Claims, 5 Drawing Sheets

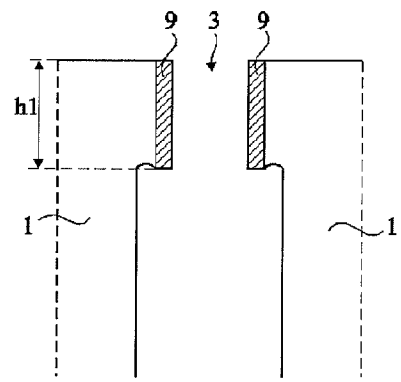
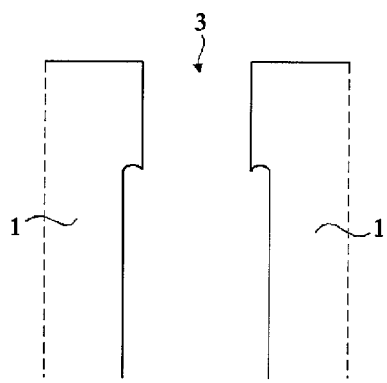
Fig 3A   Fig 3B
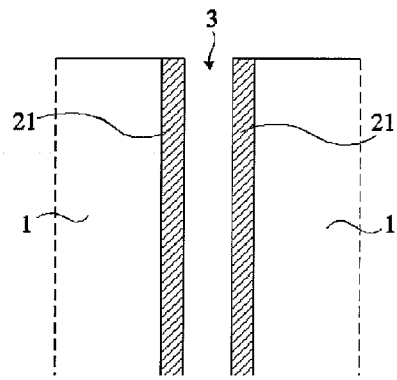
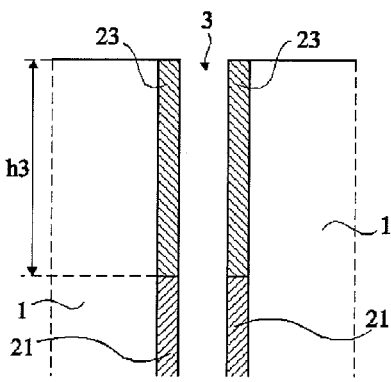
Fig 4A   Fig 4B
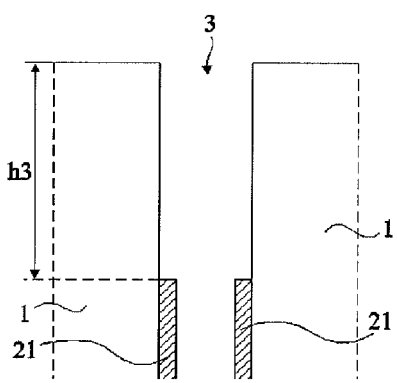
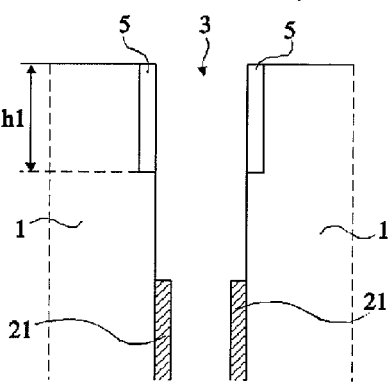
Fig 4C   Fig 4D

METHOD FOR PROCESSING PORTIONS OF WALLS OF AN OPENING FORMED IN A SILICON SUBSTRATE

BACKGROUND OF THE INVENTION

1. Field of the Invention

The present invention relates to semiconductor structures and, more specifically, to the processing of local areas of one or several walls of an opening or trench formed in a semiconductor substrate.

2. Discussion of the Related Art

To form electronic components on a semiconductor substrate, it may be necessary to create, in the substrate, one or several vertical openings or trenches that may be through or non-through openings. Such openings may then be processed in various ways. For example, the opening walls may be heavily doped. The openings may then be filled with insulating or conductive materials, or with an alternation of insulating and conductive layers.

SUMMARY OF THE INVENTION

It may also be desired to process, down to a certain depth only, one or several walls of a vertical opening or trench, for example, to form heavily-doped buried wells or to perform an etching from one or several walls of the opening.

Various methods enabling forming of a mask on one or several walls of an opening formed in a semiconductor substrate are here provided, this mask enabling performing dopant implantations or etchings down to a given depth on the opening wall(s).

Thus, an embodiment of the present invention provides a method for processing at least one wall of an opening formed in a silicon substrate, successively comprising the steps of:

(a) implanting fluorine atoms into an upper portion of the wall of the opening;

(b) performing an oxidization step; and (c) applying a specific processing to at least a portion of the non-implanted portion of the opening.

According to an embodiment of the present invention, step (a) is preceded by the steps of:

forming an oxide layer on the opening wall;

implanting dopants into the oxide layer at the level of the upper portion of the wall and at the level of an intermediary portion of the wall located under the upper portion of the wall, the dopants being selected from the group comprising boron, phosphorus, and arsenic; and removing the oxide which has been doped at the level of the upper and intermediary portions of the wall.

According to an embodiment of the present invention, step (c) comprises implanting dopants into the upper portion of the wall and into the intermediary portion of the wall located under the upper portion of the wall, the dopants being selected from the group comprising boron, phosphorus, and arsenic.

According to an embodiment of the present invention, step (c) comprises the steps of deoxidizing at least an intermediary portion of the wall located under the upper portion of the wall, then of implanting dopants into the intermediary portion of the wall, the dopants being selected from the group comprising boron, phosphorus, and arsenic.

According to an embodiment of the present invention, step (c) comprises the steps of deoxidizing at least an intermediary portion of the wall located under the upper portion of the wall, then of etching, in the opening, the silicon substrate unprotected by oxide.

According to an embodiment of the present invention, step (c) is followed by a step of total deoxidation of the opening.

According to an embodiment of the present invention, the implantations of dopants and of fluorine atoms are implantations oblique with respect to the direction of the opening.

According to an embodiment of the present invention, the opening does not cross the substrate.

An embodiment of the present invention provides a junction vertical field-effect transistor formed in a lightly-doped N-type silicon substrate comprising, in the upper portion of the substrate, a source electrode in contact with the substrate via a heavily-doped N-type region and, in the lower substrate portion, a drain region in contact with the substrate via a heavily-doped N-type region, the source region being surrounded with openings filled with a conductor connected to the transistor gate, the walls of these openings being coated with oxide, except for deep areas from which P-type doped areas extend.

An embodiment of the present invention provides a silicon fuel cell support comprising non-through vertical openings and through vertical openings, the upper ends of the non-through openings emerging on active portions of the fuel cell and the upper ends of the through openings emerging on non-active portions of the fuel cell, horizontal openings being formed in depth on the walls of the vertical openings, the horizontal openings enabling forming paths between the vertical openings.

The foregoing and other objects, features, and advantages of the present invention will be discussed in detail in the following non-limiting description of specific embodiments in connection with the accompanying drawings.

BRIEF DESCRIPTION OF THE DRAWINGS

FIGS. 3A and 3B are cross-section views illustrating successive steps of a method for etching a portion of the walls of an opening formed in a silicon substrate;

FIGS. 4A to 4G are cross-section views illustrating successive steps of a second method for forming a heavily-doped buried well extending from the walls of an opening formed in a silicon substrate;

DETAILED DESCRIPTION

Figure 1A:
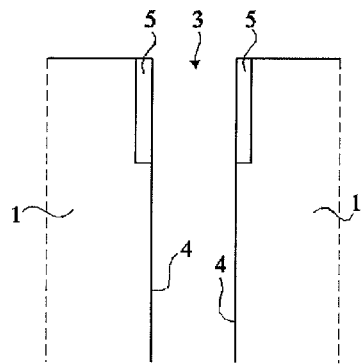
FIGS. 1A to 1D are cross-section views illustrating successive steps of a first method for forming a heavily-doped well extending from walls of an opening formed in a silicon substrate.

For clarity, the same elements have been designated with the same reference numerals in the different drawings and, further, as usual in the representation of semiconductor structures, the various drawings are not to scale.

FIGS. 1A to 1D are cross-section views illustrating successive steps of a method for forming a heavily-doped buried well extending from the walls of an opening formed in a silicon substrate.

FIG. 1A shows the upper portion of a silicon substrate 1. An opening 3 is formed in this substrate. This opening extends either across the entire substrate thickness or only down to a limited depth thereof. In the following, it can be considered that the opening has the shape of a rectilinear trench but it may of course have any desired shape. It may, for example, have a circular cross-section and/or be formed of trench portions joining at various angles. On the upper portion of two opposite surfaces 4 of opening 3, fluorine atoms 5 have been implanted. Implanted areas 5 may result from two oblique implantations symmetrical with respect to the vertical direction. If it is desired to implant the entire periphery of the upper region of opening 3, an oblique implantation may be maintained while the substrate is rotated on a support.

Figure 1B:
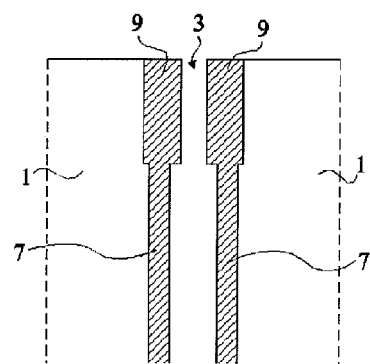

FIG. 1B shows the structure obtained after having performed a thermal oxidation step. This thermal oxidation results in that the sides of the opening are oxidized across a first thickness, at locations 7 where the opening has received no fluorine atom implantation, and across a second thickness, at locations 9 where the opening has received a fluorine atom implantation. The second thickness, in the regions having received a fluorine atom implantation, is greater than the first thickness. In FIG. 1B, no oxidation of the upper surface of substrate 1 has been shown. This assumes that the thermal oxidation has been performed while this surface was protected, for example, by a silicon nitride layer. This protection may also have been used to avoid the implantation of fluorine atoms in the upper surface of the substrate. However, this is an alternative only of the present invention and it may be provided for the upper surface of the substrate to have also received a fluorine atom implantation and to be also oxidized down to a depth substantially equal to that of regions 9.

Figure 1C:
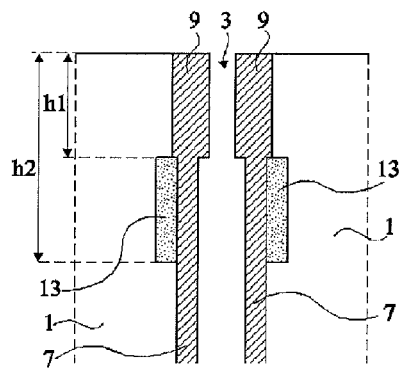

At the step illustrated in FIG. 1C, a new oblique implantation has been performed, but this time, with atoms of a dopant. The implantation power is selected so that the implanted dopants do not cross thick silicon oxide regions 9. The angle and the implantation power are selected so that a region 13 is implanted through thinner oxide layer 7 down to a limited depth. Thus, after anneal, implanted area 13 extends down to a depth ranging between depth h1 of the region having undergone the implantation of fluorine atoms and depth h2 resulting from the implanted angle selected for the oblique implantation of dopant atoms. As an example, the dopant atoms may be P-type dopants such as boron or N-type dopants such as phosphorus or arsenic.

Figure 1D:
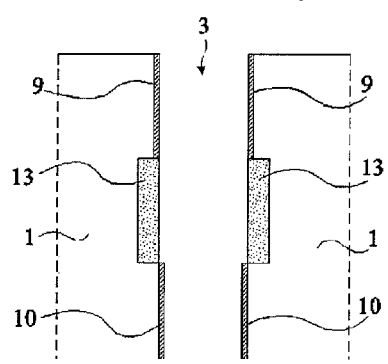

As illustrated in FIG. 1D, a step of partial deoxidation of the structure may possibly be provided after, for example, to completely eliminate oxide layer 7 while leaving in place a portion of the thickness of oxide layer 9. It should be understood that this step is optional and depends on how the device is desired to be used. As a variation, the duration of the deoxidation step may be calculated so that a silicon oxide region 10 remains in place in opening 3 under implanted regions 13. Indeed, currently, undoped oxide etches less than doped oxide.

Figure 2A:
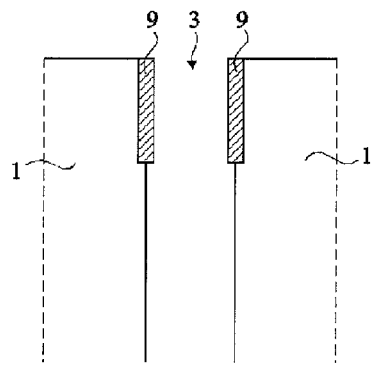
FIGS. 2A and 2B are cross-section views illustrating a variation of the method of FIGS. 1A to 1D.
Figure 2B:
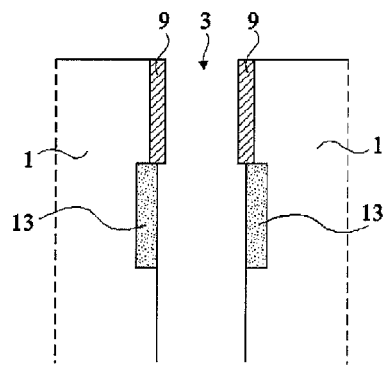

FIGS. 2A and 2B illustrate an alternative embodiment of the above-described method. It is started from the structure state such as shown in FIG. 1B but, as illustrated in FIG. 2A, before performing the implantation of doped regions 13, a partial deoxidation is first performed to only leave in place thinned upper oxide regions 9 and to completely or almost completely eliminate deeper and thinner oxide portions 7. This may ease the implantation of the dopant atoms in regions 13.

FIGS. 3A and 3B are two cross-section views illustrating another variation of a method according to an embodiment of the present invention. It is, for example, started from the structure illustrated in FIG. 2A and, instead of performing an implantation of dopant atoms 13 down to a limited depth of the opening, an etch step, for example, an isotropic etching, is performed. This etching may be a plasma etch or a wet etch. The walls of opening 3 are thus hollowed under the region protected by oxide 9. FIG. 3B shows an optional step that may follow the step of FIG. 3A. In FIG. 3B, the structure has been shown after elimination of oxide regions 9.

It should be noted that the use of the method described in FIGS. 3A and 3B results in an etching of the walls of the opening or trench across its entire depth from depth h1 corresponding to the bottom of the region in which fluorine atoms have been implanted.

Figure 4E:
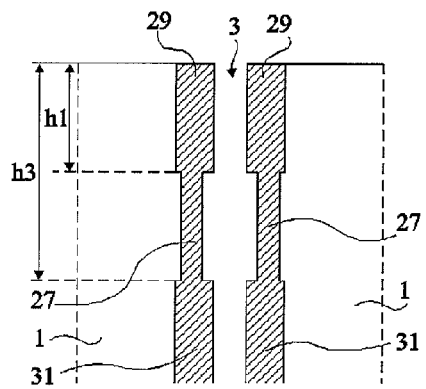
Figure 4F:
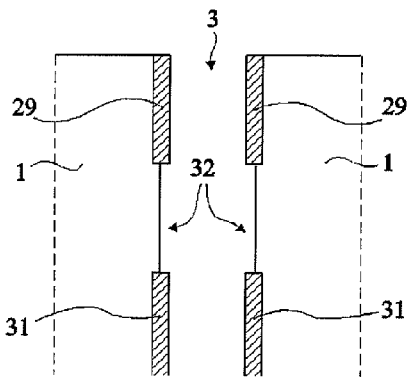
Figure 4G:
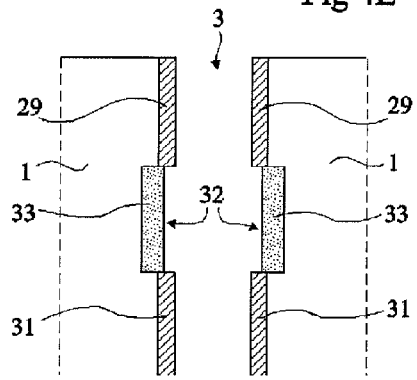
Figure 5:
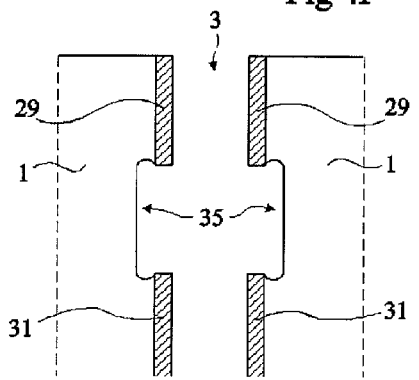
FIGS. 5 and 6 illustrate variations of the method of FIGS. 4A to 4G.
Figure 6:
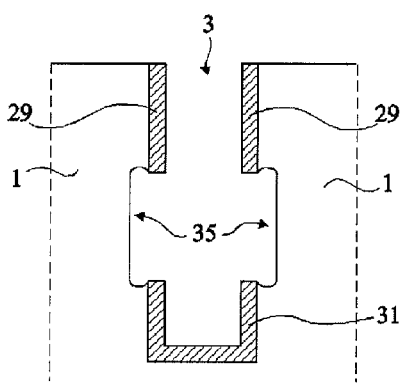

FIGS. 4 to 6 illustrate various alternatives of another embodiment of the method described herein, in which it is desired to perform a processing down to a well-delimited depth of an opening, at a given depth with respect to the upper surface of the substrate in which the opening is formed.

FIG. 4A is another cross-section view of the upper portion of a silicon substrate 1 in which an opening or trench 3 has been formed. At the step illustrated in FIG. 4A, a thermal oxidation has first been performed. This thermal oxidation causes the forming of a silicon oxide layer 21 on the walls of opening 3, and possibly, if it is not protected, an oxidation (not shown) of the upper surface of silicon substrate 1.

At the step illustrated in FIG. 4B, an oblique implantation of upper portion 23 of oxide layer 21 by dopant atoms such as boron, phosphorus, or arsenic atoms has been performed. This implantation is performed in the upper portion of the oxide layer down to a depth h3. The implantation power is selected so that the dopant atoms penetrate into the oxide layer but do not cross it.

At the step illustrated in FIG. 4C, the silicon oxide has been etched. This etching is limited in time, to completely etch portion 23 of the oxide layer which has received the dopant atoms and to only partially etch portion 21 of the oxide layer which has not been implanted. This step results in an opening having its entire lower portion coated with an oxide layer 21 and having at least one wall of its upper surface stripped so that silicon substrate 1 is exposed. In FIG. 4C, the two opposite surfaces of the opening have been shown as exposed. The entire contour of the upper portion of the opening may of course also be stripped, or conversely a single wall of this opening may be exposed.

After this, at the step illustrated in FIG. 4D, the process described in relation with FIG. 1 is resumed. Thus, in FIG. 4D, it can be seen that fluorine atoms 5 have been implanted in the upper portion of the opening down to a depth h1 smaller than depth h3. This implantation is shown as being performed on two opposite surfaces of the opening. In the same way as described previously, it may be performed all around the opening or on a single surface thereof.

In FIG. 4E, as in FIG. 1B, a thermal oxidation step is carried out. As a result, oxide layer 21 in the lower portion of the opening thickens to provide an oxide layer 31, a thinner oxide layer 27 forms between depths h1 and h3, and a thicker oxide layer 29 forms down to depth h1.

At the step illustrated in FIG. 4F, a partial deoxidation of the structure has been performed, so that the thinnest oxide layer 27 is removed in the area designated with reference numeral 32 while a portion at least of thicker oxide layers 29 and 31 remains in place.

At the step illustrated in FIG. 4G, a doped region 33 has been formed at the level of area 32, between depths h1 and h3. The doping may be performed by any desired means in the illustrated case where a complete deoxidation of the concerned region located between depths h1 and h3 has been performed. This doping may for example result from a diffusion based on doped polysilicon formed in the opening or from a diffusion performed based on a gaseous predeposition. This doping may also be performed by oblique implantation, but then the implantation angle needs not be carefully selected since the area to be doped, 32, has been delimited by oxide regions 29 and 31. It should be noted that, in the case of an oblique implantation, the implantation may be performed through a thin oxide layer remaining in place in area 32.

In FIG. 5, it has been shown that instead of doping area 32 of the opening located between depths h1 and h3, an etching can be performed to form recesses 35 extending from area 32.

In the foregoing, it has been stated that opening or trench 3 could extend down to a great depth from the upper surface of the substrate and possibly across the entire thickness of this substrate. Opening or trench 3 could also have a limited depth, and this applies to all the variations of the previously-described method.

FIG. 6 shows the case of an opening of limited depth in correspondence with the structure illustrated in FIG. 5. In this case, oxide 31 coats the opening walls under depth h3, as in FIG. 5, but the bottom of the opening is also oxidized.

Figure 7A:
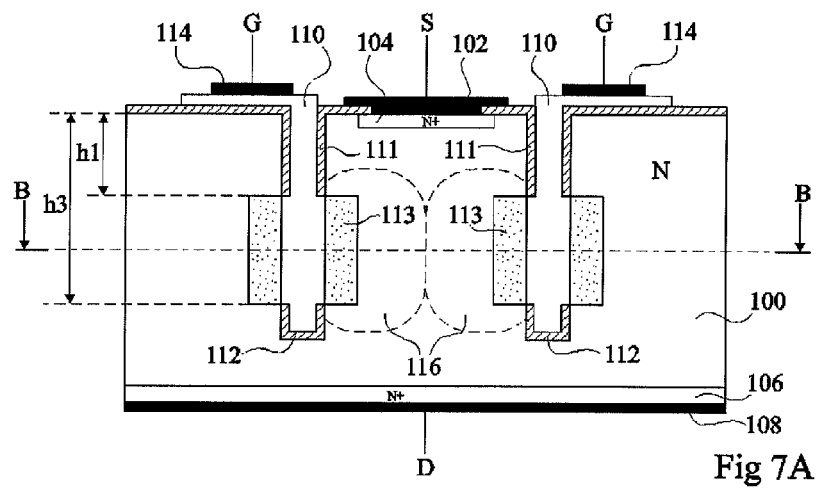
FIGS. 7A and 7B show an example of application of a method according to an embodiment of the present invention.
Figure 7B:
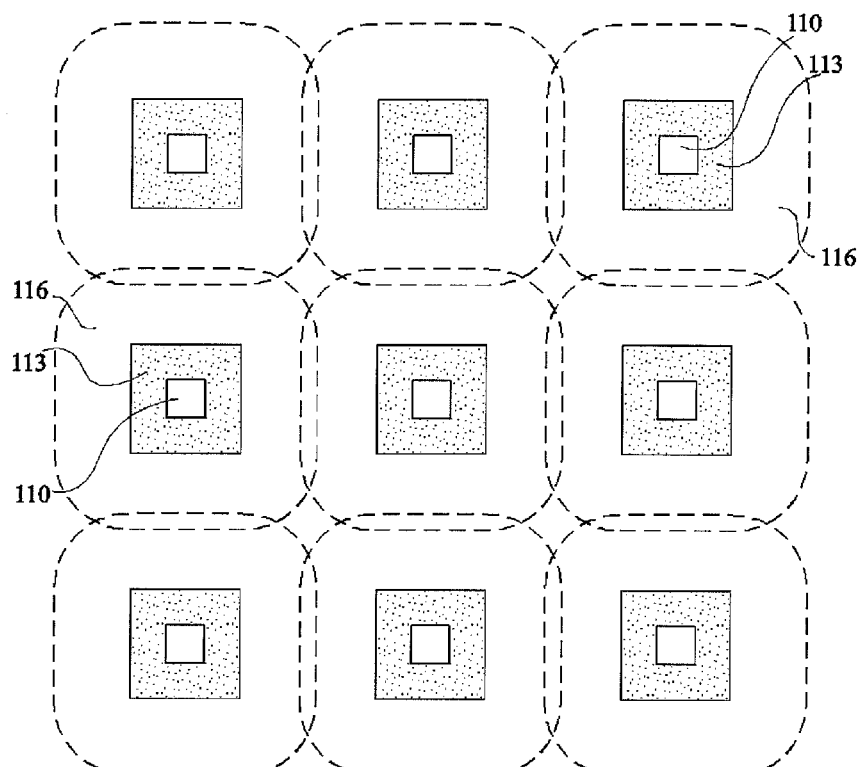

FIGS. 7A and 7B show an example of application of the previously-described method in which buried doped layer portions are formed from at least one wall of an opening.

More specifically, FIG. 7A is a side cross-section view and FIG. 7B is a top cross-section view of cells of a junction vertical field-effect transistor (JFET). Multiple cells are formed in an N-type silicon substrate 100. Each cell comprises, on its upper surface side, a source electrode 102 in contact, via a more heavily-doped N-type 104, with substrate 100. On the lower surface side of substrate 100, there extends a heavily-doped N-type region (N$^+$) 106 possibly having, conversely to what has been shown, a relatively large thickness, in which case substrate 100 is in fact an epitaxial layer formed on this N$^+$ region 106. Region 106 is covered with a drain metallization 108. The source region is surrounded with openings 110 filled with a conductor, for example, doped polysilicon. As in the previously-described method, the upper portion of the opening, down to a depth h1, is coated with oxide 111, and the lower portion of this opening, beyond a depth h3, is coated with oxide 112. Between depths h1 and h3, doped areas 113 are formed. These doped areas for example result from a diffusion of dopant atoms from the heavily-doped polysilicon filling openings 110. Gate metallizations 114 are in contact with the conductor filling openings 110. In a first state, where the gate is not biased, there is no conduction through N region 100 between source and drain regions 104 and 106. However, when the gate is properly biased, the thinning of depleted areas 113 allows the circulation of charges. This is the conventional operation of a so-called "normally off" JFET transistor. It should be noted that the structure is formed in particularly simple fashion due to the previously-described method.

FIG. 7B is a cross-sectional top view along section plane B-B of FIG. 7A. It shows a set of cells identical to those of FIG. 7A.

Figure 8:
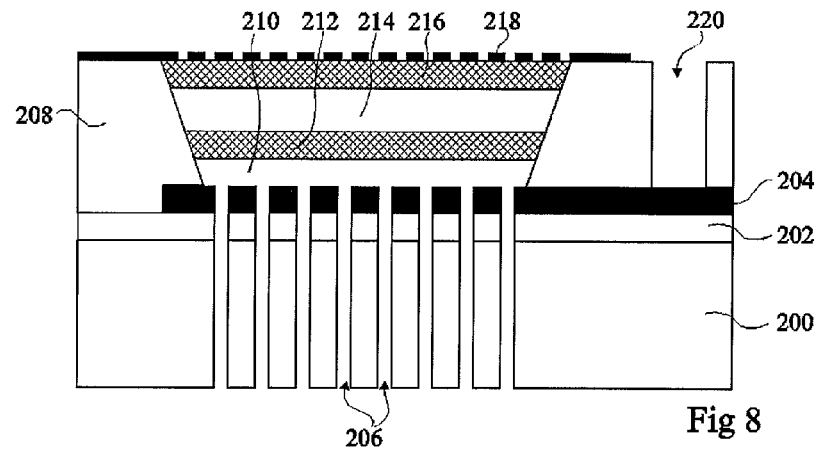
FIG. 8 illustrates a known fuel cell.

FIG. 8 illustrates an integrated fuel cell. On a silicon support 200 is formed an insulating layer 202 topped with a conductive layer 204 forming the anode collector of the fuel cell. Through openings 206 are formed in silicon support 200, insulating layer 202, and conductive anode collector layer 204. On conductive layer 204 is formed a thick insulating layer 208. In each of several openings formed in layer 208 is formed a stack of a catalyst support 210, of a first catalyst layer 212, of an electrolyte layer 214, and of a second catalyst layer 216, with catalyst 216 flushing the upper surface of insulating layer 208. Above second catalyst layer 216 is formed a conductive cathode collector layer 218 which comprises through openings across its entire surface. An opening 220 enabling contact with conductive anode collector layer 204 is formed in insulating layer 208.

To operate the fuel cell, hydrogen is injected into openings 206 of support 200. The hydrogen is "broken down" at the level of catalyst layer 212 to form, on the one hand, H$^+$ protons which direct towards electrolyte layer 214 and, on the other hand, electrons which direct towards anode collector 204. The H$^+$ protons cross electrolyte layer 214 to reach catalyst layer 216. Layer 216 is in contact with oxygen, for example, the ambient air, and the H$^+$ protons recombine with oxygen. This results in a voltage difference between the anode and the cathode.

Figure 9A:
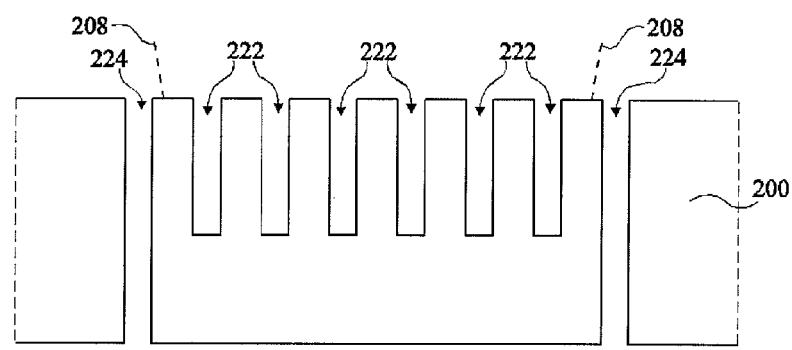
FIGS. 9A and 9B show another example of application of a method according to an embodiment of the present invention.
Figure 9B:
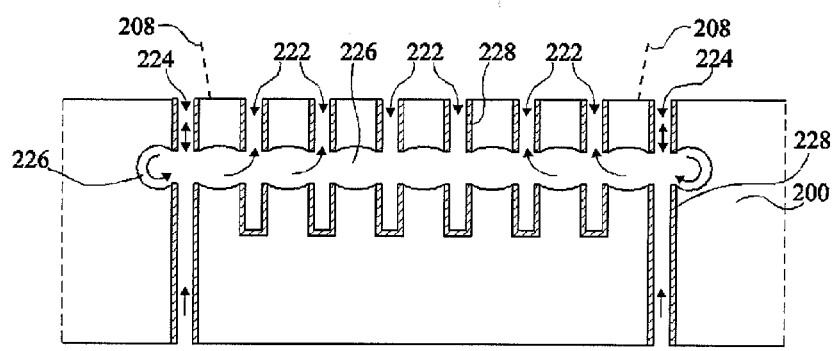

FIGS. 9A and 9B illustrate steps of the forming of a fuel cell support 200 according to an embodiment of the present invention. Dotted lines 208 indicate the limits of the stack of catalyst support 210, of first catalyst layer 212, of electrolyte layer 214, and of second catalyst layer 216.

At the step illustrated in FIG. 9A, non-through openings 222 are formed in support 200. Through openings 224 are formed on either side of non-through openings 222 in support 200 to enable hydrogen supply of the fuel cell. Dotted lines 208 illustrate the fact that the active stack of the cell is formed at the level of non-through openings 222 but does not extend at the level of through openings 224. In other words, through openings 224 emerge opposite to thick insulating layer 208 of FIG. 8.

At the step illustrated is FIG. 9B, the method previously described in relation with FIGS. 4A to 4F and 5 has been applied to openings 222 and 224. Horizontal openings 226 are thus formed down to a desired depth of support 200 on either side of openings 222 and 224, horizontal openings 226 joining between vertical openings 222 and 224. In FIG. 9B, an oxide layer 228 is present on the walls of vertical openings 222 and 224. Layer 228 may be removed, if desired, once horizontal openings 226 have been formed.

The structure of FIG. 9B has the advantage of avoiding for hydrogen to be directly sent onto catalyst layer 212. Indeed, as shown by arrows in FIG. 9B, the hydrogen arriving in openings 224 passes through horizontal openings 226, then through vertical openings 222 to reach catalyst layer 212. This enables setting the pressure peaks of the hydrogen reaching catalyst layer 212, for example, at times when a hydrogen bottle is opened. A risk of separation of the active stack of the fuel cell is thus eliminated.

Specific embodiments of the present invention have been described. Various alterations, modifications, and improvements which will occur to those skilled in the art. In particular, it is possible to form several specific areas on the walls of openings formed in a silicon substrate. Indeed, once a first area has been processed on the opening walls, it is possible to repeat the method described in relation with FIGS. 4A to 4F to obtain a second mask enabling processing another wall area. At the step of FIG. 4B, the dopant implantation will be performed down to an adapted depth. Further, it is possible to carry out, on the same wall, different processings. For example, it is possible to perform an etching on a portion of the wall(s) and to form a heavily-doped well on another portion of the wall(s).

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for processing at least one wall of an opening formed in a silicon substrate, successively comprising the steps of:
   (a) implanting fluorine atoms into an upper portion of the wall of the opening;
   (b) performing an oxidization of the wall of the opening; and
   (c) etching at least a portion of a non-implanted portion of the wall of the opening or implanting a dopant therein, wherein the non-implanted portion of the wall of the opening is located below the upper portion of the wall of the opening, wherein step (a) is preceded by the steps of:
   forming an oxide layer on the opening wall;
   implanting dopants into the oxide layer at the level of said upper portion of the wall and at the level of an intermediary portion of the wall located under the upper portion of the wall, the dopants being selected from the group consisting of boron, phosphorus and arsenic; and
   removing the oxide which has been doped at the level of the upper and intermediary portions of the wall.

2. The method of claim 1, wherein step (c) comprises implanting the dopant into said upper portion of the wall and into an intermediary portion of the wall located under the upper portion of the wall, the dopant being selected from the group consisting of boron, phosphorus, and arsenic.

3. The method of claim 1, wherein step (c) comprises the steps of deoxidizing at least an intermediary portion of the wall located under said upper portion of the wall, and then implanting the dopant into the intermediary portion of the wall, the dopant being selected from the group consisting of boron, phosphorus, and arsenic.

4. The method of claim 1, wherein step (c) comprises the steps of deoxidizing at least an intermediary portion of the wall located under the upper portion of the wall, and then etching, in the opening, the silicon substrate unprotected by oxide.

5. The method of claim 1, wherein step (c) is followed by a step of total deoxidation of the opening.

6. The method of claim 1, wherein the implanting of the dopant and of fluorine atoms are implantations oblique with respect to the direction of the opening.

7. The method of claim 1, wherein the opening does not cross the substrate.

8. A method for processing a silicon substrate, comprising:
   forming at least one vertical opening in the substrate, the substrate having a wall;
   implanting fluorine into the wall of the opening to a first vertical depth to form a first wall region;
   oxidizing the wall of the vertical opening in the first wall region and in a second wall region having a greater vertical depth than the first wall region, wherein the implanted first wall region and the second wall region of the vertical opening are oxidized; and
   processing the second wall region of the vertical opening, wherein implanting fluorine into the wall of the vertical opening is preceded by forming an oxide layer on the wall of the vertical opening and implanting dopants into the oxide layer to a second vertical depth greater than the first vertical depth, wherein processing the second wall region of the vertical opening comprises processing the wall of the vertical opening between the first and second vertical depths.

9. A method as defined in claim 8, wherein fluorine is implanted into the wall of the vertical opening at an oblique angle with respect to the vertical opening, the oblique angle selected to implant fluorine into the wall of the vertical opening to the first vertical depth.

10. A method as defined in claim 8, wherein processing the second wall region of the vertical opening comprises implanting dopants into the second wall region.

11. A method as defined in claim 8, wherein processing the second wall region of the vertical opening comprises etching the second wall region.

12. A method as defined in claim 8, wherein implanting fluorine is preceded by removing the doped oxide layer to the second vertical depth.

13. A method as defined in claim 8, wherein processing the second wall region of the vertical opening comprises implanting dopants into the first wall region and into the second wall region, the dopants including at least one of boron, phosphorus and arsenic.

14. A method as defined in claim 8, wherein processing the second wall region of the vertical opening comprises deoxidizing at least the second wall region and then implanting dopants into the second wall region.

15. A method as defined in claim 8, wherein processing the second wall region of the vertical opening comprises deoxidizing the second wall region and then etching the silicon substrate in the second wall region.

16. A method as defined in claim 8, wherein processing the second wall region of the vertical opening is followed by total deoxidation of the vertical opening.

17. A method as defined in claim 8, wherein forming at least one vertical opening comprises forming a vertical opening through the substrate.

18. A method as defined in claim 8, wherein forming at least one vertical opening comprises forming a vertical opening of limited depth having a bottom.

* * * * *